United States Patent
Schemmann et al.

(10) Patent No.: US 7,286,017 B2
(45) Date of Patent: Oct. 23, 2007

(54) CONTROLLABLE RF BROADBAND AND AMPLIFIER WITH A CONSTANT INPUT IMPEDANCE

(75) Inventors: Heinrich Schemmann, Villingen-Schwenningen (DE); Mehmet Ipek, Villingen-Schwenningen (DE); Sabine Roth, Mönchweiler (DE)

(73) Assignee: Thomson Licensing, Boulogne-Billancourt (FR)

( * ) Notice: Subject to any disclaimer, the term of this patent is extended or adjusted under 35 U.S.C. 154(b) by 128 days.

(21) Appl. No.: 10/541,855

(22) PCT Filed: Dec. 5, 2003

(86) PCT No.: PCT/EP03/13741

§ 371 (c)(1),
(2), (4) Date: Jul. 11, 2005

(87) PCT Pub. No.: WO2004/064250

PCT Pub. Date: Jul. 29, 2004

(65) Prior Publication Data

US 2006/0125565 A1    Jun. 15, 2006

(30) Foreign Application Priority Data

Jan. 9, 2003   (DE) ................................ 103 00 431

(51) Int. Cl.
*H03F 3/68* (2006.01)
(52) U.S. Cl. ...................................... 330/295; 330/278
(58) Field of Classification Search ............... 330/284, 330/295, 278
See application file for complete search history.

(56) References Cited

U.S. PATENT DOCUMENTS 6,265,936 B1    7/2001   Heigl et al.
6,288,608 B1    9/2001   Jadus et al.
7,057,457 B2 *  6/2006   Irvine et al. ................. 330/252

FOREIGN PATENT DOCUMENTS

DE    19854847    6/2000
JP    10190378    7/1998

OTHER PUBLICATIONS

Copy of Search Report Dated Jul. 18, 2003.

* cited by examiner

*Primary Examiner*—Robert Pascal
*Assistant Examiner*—Hieu Nguyen
(74) *Attorney, Agent, or Firm*—Joseph J. Laks; Robert D. Shedd; Brian J. Cromarty

(57) ABSTRACT

A variable-gain RF amplifier arrangement whose input impedance is essentially independent of the selected gain is proposed, which has a large number of selectable elementary amplifiers, with an input signal being scaled and the input impedance being set to be the same by means of switchable current limiting elements upstream of the elementary amplifiers, which are associated with the elementary amplifiers. The circuit also has a low noise level, which is largely independent of the selected gain, and good linearity. A broadcast radio receiver as well as a receiver for receiving data signals using an amplifier according to the invention are also proposed.

16 Claims, 3 Drawing Sheets

CONTROLLABLE RF BROADBAND AMPLIFIER WITH A CONSTANT INPUT IMPEDANCE

This application claims the benefit, under 35 U.S.C. § 365 of International Application PCT/EP03/013741, filed Dec. 5, 2003, which was published in accordance with PCT Article 21(2) on Jul. 29, 2004 in English and which claims the benefit of German patent application No. 10300431.9, filed Jan. 9, 2003.

The invention relates to the field of controllable radio-frequency amplifiers, in particular controllable gain radio-frequency amplifiers, whose input impedance is independent of the gain. A further aspect of the invention relates to receivers for modulated radio-frequency signals.

Signals which have a wide dynamic range are processed in radio-frequency amplifiers, such as those used in radio and television receivers, or satellite receivers. Radio-frequency amplifiers of this type are normally used as input amplifiers. In order to allow both weak and strong signals to be processed by the radio-frequency amplifier, it is desirable for the gain level to be adjustable. The signal level can thus be matched to the downstream signal processing stages. When a weak signal is applied to the input amplifier, the amplifier has to operate with high gain while, at the same time, as little interference as possible may be added to the signal. Undesirable interference includes, for example, noise and distortion. When a strong signal is applied to the input of the amplifier, the amplifier has to operate with less gain, and must not be saturated by the signal. In both modes, good linearity and an input impedance which remains the same over a wide frequency range are desirable.

Amplifiers with a constant input impedance and variable gain are known from the prior art, in which a symmetrical input signal is passed to two or more differential amplifiers with different gain factors. The individual differential amplifiers can be connected depending on the desired gain, and have a high input impedance. The input impedance of the entire circuit is set by means of a low impedance, which is connected between the differential inputs and is very small in comparison to the high input impedances of the differential amplifiers. The input impedances of the amplifiers can thus be ignored. Circuits such as these frequently have an undesirable noise response, and the circuit configuration as a differential amplifier for a symmetrical input signal considerably increases the circuit complexity.

A variable gain for a radio-frequency amplifier can also be achieved by use of a variable control of the operating point of the amplifier in the linear region. However, shifting the operating point of an amplifier can result in changes in the phase response or in the bandwidth.

One object of the invention is now to propose a radio-frequency amplifier with a constant input impedance, a variable gain, high linearity and an improved noise response. One amplifier such as this is described in claim 1. Advantageous refinements of the amplifier according to the invention are specified in the dependent claims. A further object of the invention is to propose a receiver for modulated radio-frequency signals.

The amplifier according to the invention comprises two or more elementary amplifiers which are connected in parallel and are selected as a function of the desired amplification level. The input signal is passed in parallel to all the elementary amplifiers. The input impedance of one elementary amplifier is in this case at the same time used for scaling the input signal. The individual elementary amplifiers each have essentially the same gain. The selection of one specific elementary amplifier at the same time results in selection of the input impedance which is associated with this amplifier. Those amplifiers which are not selected as well as the impedances associated with them are disconnected from the circuit via switches, such that they do not have any influence on the input impedance of the active circuit part. The switches are, for example, switching diodes, although transistor switches or the like may also be used. It is also possible to use different types of switch in different circuit parts at the same time. The configuration of the radio-frequency amplifier according to the invention makes it possible to select freely variable and reproducible gain steps with little complexity, while at the same time ensuring an input impedance which is essentially independent of the gain. Furthermore, the circuit is highly suitable for integration in an integrated circuit.

The field of application of the invention is not restricted to the radio, television and satellite receivers mentioned initially. The radio-frequency amplifier according to the invention may be used in all appropriate applications which require constant input impedances and variable gains.

In a second aspect of the invention, a receiver is proposed for receiving broadcast radio signals using a radio-frequency amplifier according to the invention. In this case, broadcast radio receivers are receivers for analog or digital audio and/or video transmissions, such as receivers for VHF radio, digital audio broadcast (DAB) or digital television (DVB). Although a receiver according to the invention can be used particularly advantageously for receiving wireless transmissions, the receiver is also suitable for cable transmissions.

In a third aspect of the invention, a receiver is proposed for receiving data signals using a radio-frequency amplifier according to the invention. A receiver such as this is used, inter alia, in wireless or cable communications networks. In this case, communications networks comprise both cable data networks, such as Local Area Networks (LAN) or Controller Area Networks (CAN), and wireless data networks, such as the Universal Mobile Telecommunications System (UMTS), the Global System for Mobile Communication (GSM) or the Digital Enhanced Cordless Telephone (DECT). The data content, the frequency range used and the type of modulation are in this case irrelevant. It is thus possible to receive computer data or else speech data, and the circuit arrangement is not restricted to specific frequency ranges.

The radio-frequency amplifier according to the invention will now be described in more detail with reference to the drawing, in which.

In the figures, identical reference symbols denote the same or similar elements.

Figure 1:
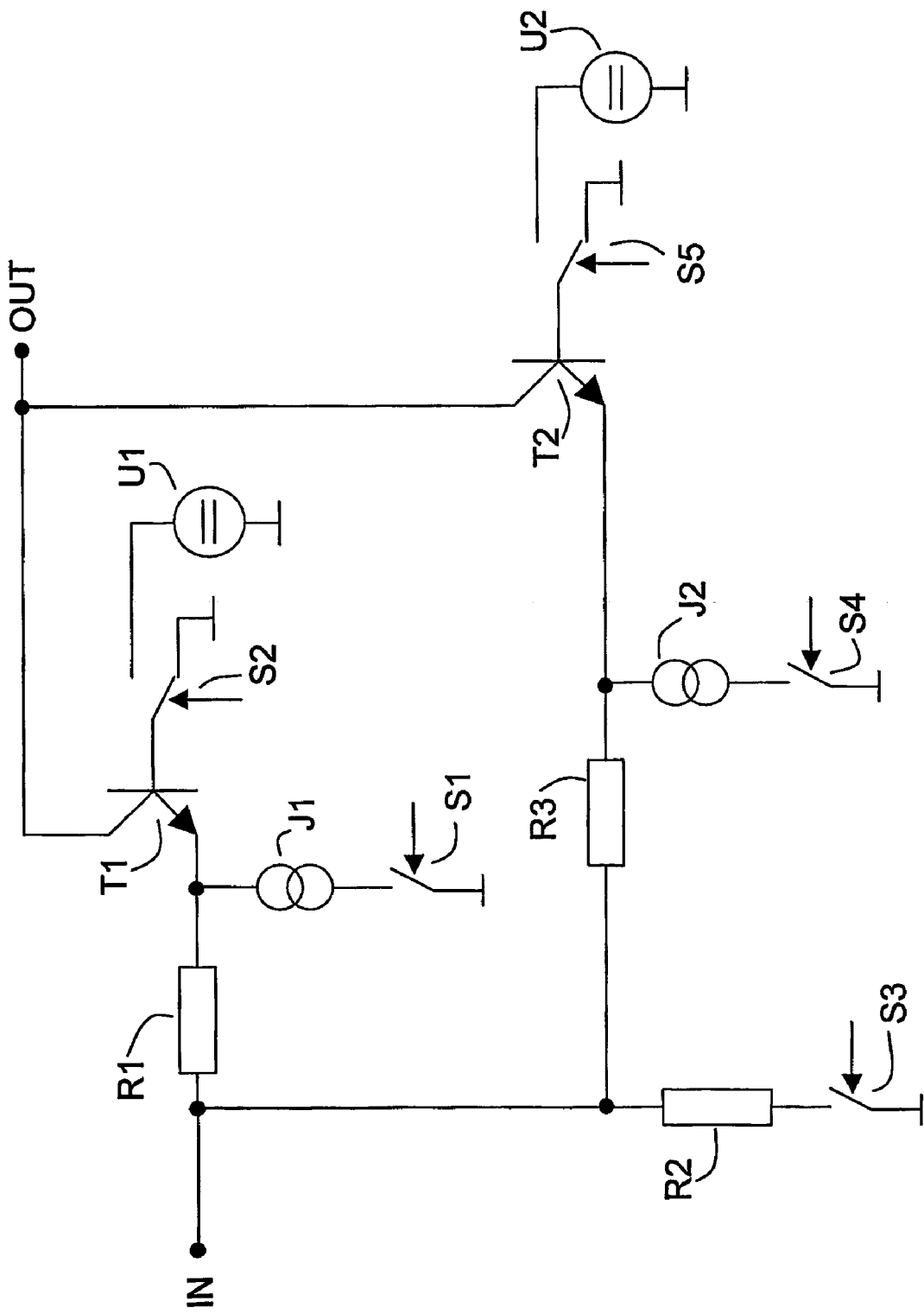
FIG. 1 shows a schematic illustration of a radio-frequency amplifier according to the invention having two amplification stages.

In the schematic illustration of a radio-frequency amplifier according to the invention as shown in FIG. 1, an input signal, which is not shown, is passed to an input IN. The input IN is connected to a first and to a second parallel-connected amplifier branch. The first amplifier branch has a resistor R1, whose first connection is connected to the input IN, and whose second connection is connected to the emitter electrode of a transistor T1. A current source J1 which can be switched on via a switch S1 is also connected to the emitter electrode of the transistor T1. The base connection of the transistor T1 is connected to a switch S2, by means of which the base can be connected either to ground or to a DC voltage source U1. The collector of the transistor T1 forms the output of the circuit, and is connected to the output OUT. The second amplifier branch is also connected to the input IN. The second amplifier branch has a resistor R2, whose first connection is connected to the input IN of the amplifier. The resistor can be connected to ground via a switch S3 which is connected to a second connection of the resistor R2. The first connection of the resistor R2 and the input IN are also connected to a resistor R3 via which the emitter electrode of a transistor T2 is connected to the input IN. The emitter electrode of the transistor T2 is also connected to a current source J2, which is connected in a switchable manner to ground via a switch S4. The base connection of the transistor T2 is connected via a switch S5 to ground or to a DC voltage source U2. The collector connection of the transistor T2 is connected to the collector connection of the transistor T1 and, together with it, forms the output OUT.

Figure 2:
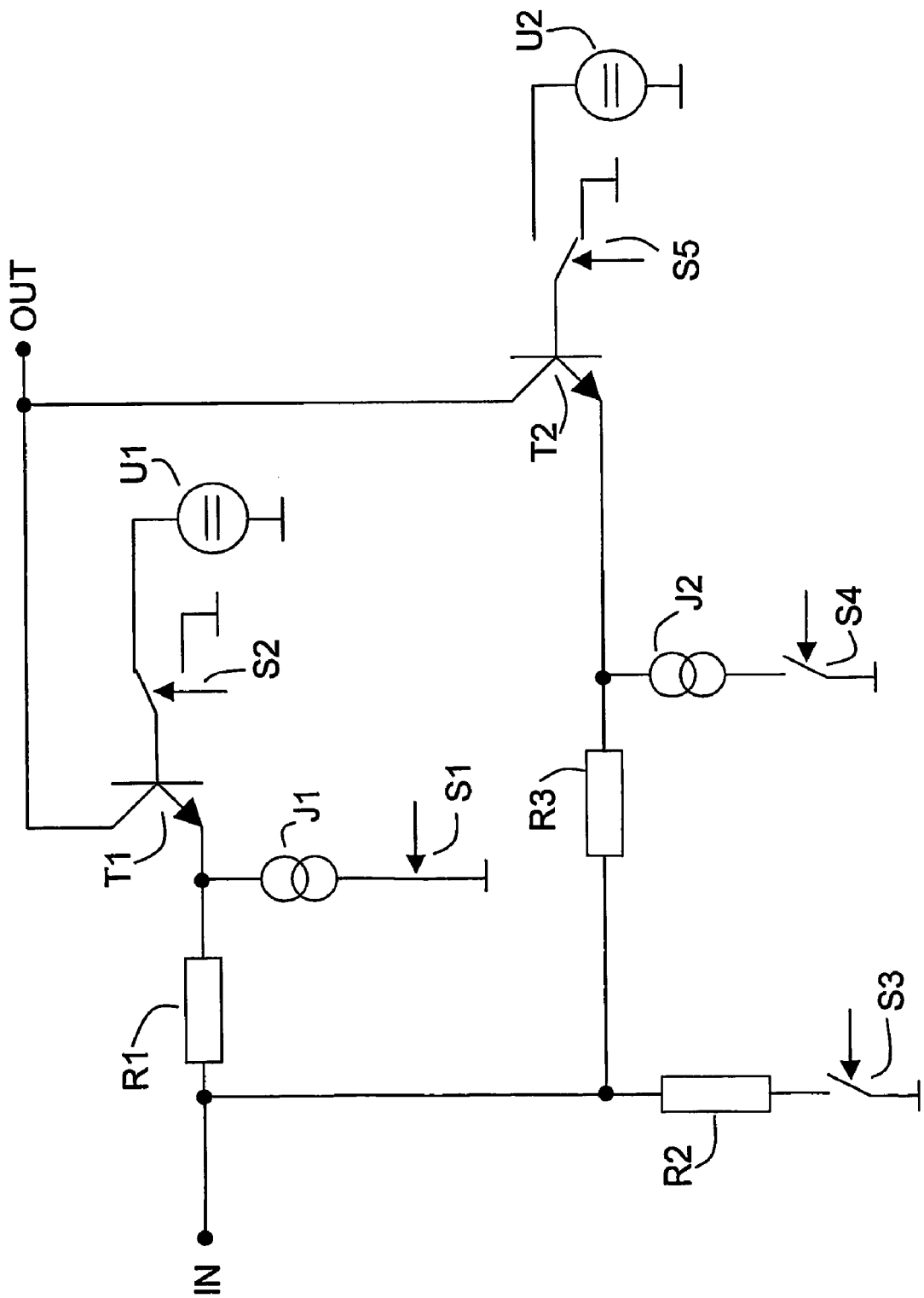
FIG. 2 shows the circuit of the radio-frequency amplifier according to the invention as shown in FIG. 1, with a first selected gain level.

The first amplifier branch is activated when the radio-frequency amplifier as shown in FIG. 1 is in the configuration shown in FIG. 2. For this purpose, the switch S1 is closed, and the current source J1 is thus activated. The switch S2 connects the base of the transistor T1 to the DC voltage source U1. A signal which is applied to the input IN, but is not illustrated, is now passed via the resistor R1 to the emitter connection of the transistor T1. The current source J1 and the potential U1 at the base of the transistor T1 set the operating point of the transistor. The signal is passed from the collector connection of the transistor T1, which is in this mode operated as a common-base circuit, to the output OUT. Since the switch S3 is open, only a first connection of the resistor R2 is connected to the circuit, and it therefore has no effect. The open switch S4 deactivates the current source J2, and the switch S5 connects the base of the transistor T2 to ground potential. Only one connection of the resistor R3 is thus likewise effectively connected to the circuit, and it has no influence on the input impedance of the active circuit. The current source J1 has a high impedance for high frequencies, and the voltage source U1 represents a short circuit for high frequencies. Owing to the low differential resistance of the base/emitter junction of the transistor T1, the resistor R1 is connected to ground for high frequencies, via the base/emitter junction and the voltage source U1. The input impedance of the circuit is thus essentially governed by R1, and the signal is passed in its entirety to the emitter of the transistor T1.

Figure 3:
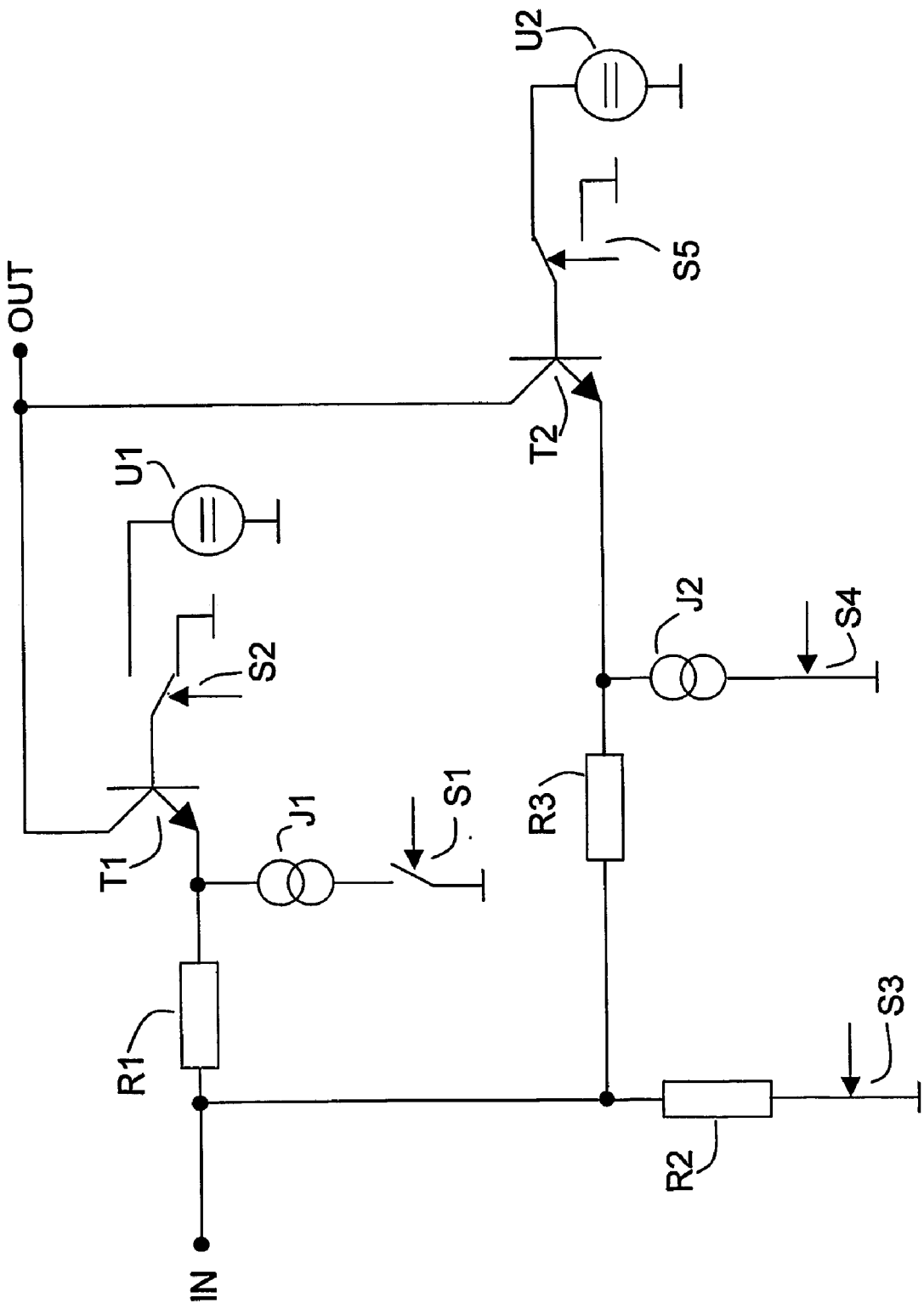
FIG. 3 shows the radio-frequency amplifier according to the invention as shown in FIG. 1, with a second selected gain level.

In the illustration of the radio-frequency amplifier according to the invention as shown in FIG. 3, the second amplifier branch is activated. For this purpose, the switch S3 is closed, and connects the input IN via the resistor R2 to ground. The input IN is also connected to the resistor R3, which connects the input IN to the emitter connection of the transistor T2. The current source J2 which is connected to the emitter connection of the transistor T2 is activated by the switch S4, which is now closed. The switch S5 connects the base connection of the transistor T2 to the DC voltage source U2. The switch S1 is open, and the switch S2 connects the base connection of the transistor T1 to ground. Only one connection of the resistor R1, which is likewise connected to the input IN, is thus effectively connected to the circuit, and has no influence on the input impedance. The operating point of the amplifier T2 is set by the DC voltage potential from the DC voltage source U2 at the base connection of the transistor T2 and the current source J2 at the emitter connection of the transistor T2. The input impedance of the amplifier circuit is formed by the resistors R2 and R3 connected in parallel. In this case, as has been described above, the resistor R2 is connected directly to ground, while the resistor R3 is connected to ground via the base/emitter junction of the transistor T2, via the switch S5 and via the DC voltage source U2. The base/emitter junction of the transistor T2 in this case has a very low differential resistance in comparison to the resistance values of the resistors R2 and R3, and is thus negligible. The DC voltage source U2 represents a short circuit to ground for high frequencies, and the current source J2 has a high impedance for high frequencies. The DC voltage source U2 and the current source J2 can thus likewise be ignored. The circuit arrangement of the resistors R2 and R3 results in a part of the signal which is applied to the input IN being tapped off directly to ground, and only a part of the signal being passed via the resistor R3 to the transistor T2. The magnitude of the part of the signal which is passed to the transistor T2 is governed by the ratio of the resistors R2 and R3. The input signal that has been scaled in this way is amplified by the transistor T2 and is produced at the output OUT. The two resistors R2 and R3 can be selected such that the parallel circuit formed by these resistors has the same value as the resistor R1 which governs the input impedance of the circuit when the first amplifier branch is activated. If, by way of example, the input signal is intended to be halved before amplification, the resistors R2 and R3 may each be twice as large as R1 from the description relating to FIG. 2. The input impedance is then calculated as follows:

$$\text{where } R2 = R3 = 2R1;$$
$$Z_{IN} = \frac{R2 \times R3}{R2 + R3} = \frac{2R1 \times 2R1}{2R1 + 2R1} = R1$$

The example described further above with reference to FIG. 2 to this extent represents a special case of the situation described with reference to FIG. 3, in that there is no resistor corresponding to the resistor R2 from FIG. 3. In order to obtain an elementary amplifier according to the invention in the general configuration as described in FIG. 3, it would thus be necessary to insert a resistor of infinitely high resistance into the circuit such that it, together with the resistor R1, forms a voltage divider for the signal, and is connected in parallel with the resistor R1 with regard to the calculation of the input impedance.

Owing to the wide range of possible ways of scaling a signal by means of two resistors while at the same time setting an essentially constant input impedance, the circuit can easily be extended by any desired gain factors. One advantageous feature in this case is that only the selected part of the circuit in each case contributes to the amplification and to the input impedance. The simple configuration of the circuit and the use of semiconductor switches particularly advantageously allow the radio-frequency amplifier according to the invention to be integrated in integrated circuits.

The invention claimed is:

1. An amplifier arrangement with a variable gain factor having at least two elementary amplifiers connected in parallel, wherein the input of each elementary amplifier has functionally exclusively associated to it individual current-limiting means which are coupled to switching means for selectively invoking one of the elementary amplifiers, and which current-limiting means scale the input signal fed to the respective associated elementary amplifier, and wherein an input impedance which remains essentially the same independent of the respective selected elementary amplifier can be set by means of the current-limiting means.

2. The amplifier arrangement as claimed in claim 1, wherein at least one elementary amplifier is a common-base transistor circuit.

3. The amplifier arrangement as claimed in claim 2, wherein means are provided in order to operate the transistors in the linear region.

4. The amplifier arrangement as claimed in claim 3, wherein the means include current sources.

5. The amplifier arrangement as claimed in claim 2, wherein at least two collector connections of the transistors of the elementary amplifiers form a common output.

6. The amplifier arrangement as claimed in claim 2, wherein the base connections of the transistors of the elementary amplifiers can be connected via switching means to DC voltage potentials.

7. The amplifier arrangement as claimed in claim 6, wherein the switching means are switching diodes and/or electronic switches.

8. The amplifier arrangement as claimed in claim 1, wherein the current-limiting means include resistors.

9. The amplifier arrangement as claimed in claim 1, wherein a first portion of an input signal can be a supplied to one elementary amplifier via a first part of the current-limiting means which are in each case associated with this elementary amplifier.

10. The amplifier arrangement as claimed in claim 1, wherein a second portion of an input signal can be tapped off with respect to signal ground via a second part of the current-limiting mearn, which are in each case associated with one elementary amplifier.

11. The amplifier arrangement as claimed in claim 1, wherein the first part and the second part of the current-limiting means, which are in each case associated with one elementary amplifier, are connected such that they represent a parallel circuit for the input signal.

12. The amplifier arrangement as claimed in claim 11, wherein the resultant impedances of the parallel circuit comprising the first part and the second part of the current-limiting means of each elementary amplifier essentially have the same values.

13. A broadcast radio receiver having an amplifier arrangement as claimed in claim 1.

14. A receiver for data signals having an amplifier arrangement as claimed in claim 1.

15. The amplifier arrangement of claim 1, wherein each of the individual elementary amplifiers essentially has the same gain.

16. The amplifier arrangement of claim 1, wherein the input signal to the amplifier arrangement is supplied to the current limiting means of all elementary amplifiers in parallel.

* * * * *